United States Patent
Kamata et al.

(10) Patent No.: US 12,243,718 B2
(45) Date of Patent: Mar. 4, 2025

(54) PLASMA PROCESSING METHOD AND PLASMA PROCESSING APPARATUS

(71) Applicant: TOKYO ELECTRON LIMITED, Tokyo (JP)

(72) Inventors: Eiki Kamata, Yamanashi (JP); Mikio Sato, Yamanashi (JP); Taro Ikeda, Yamanashi (JP); Nobuhiko Yamamoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 338 days.

(21) Appl. No.: 17/599,912

(22) PCT Filed: Mar. 23, 2020

(86) PCT No.: PCT/JP2020/012686
§ 371 (c)(1),
(2) Date: Sep. 29, 2021

(87) PCT Pub. No.: WO2020/203406
PCT Pub. Date: Oct. 8, 2020

(65) Prior Publication Data
US 2022/0199369 A1    Jun. 23, 2022

(30) Foreign Application Priority Data

Apr. 3, 2019 (JP) .................................. 2019-071541

(51) Int. Cl.
*H01J 37/32* (2006.01)

(52) U.S. Cl.
CPC .... *H01J 37/3222* (2013.01); *H01J 37/32238* (2013.01); *H01J 2237/332* (2013.01); *H01J 2237/334* (2013.01)

(58) Field of Classification Search
CPC .................. H01J 15/00; H01J 37/32091; H01J 37/32082; H01J 37/3244; H01J 37/32623;
(Continued)

(56) References Cited

U.S. PATENT DOCUMENTS 5,234,526 A * 8/1993 Chen .................. H01J 37/32192
                                                118/252
5,803,975 A * 9/1998 Suzuki .............. H01J 37/32192
                                                118/723 MR
(Continued)

FOREIGN PATENT DOCUMENTS

JP    2015-053172 A    3/2015
JP    2017-103454 A    6/2017
(Continued)

OTHER PUBLICATIONS

PCT International Search Report, PCT Application No. PCT/JP2020/012686, Jun. 9, 2020, 9 pages (with English translation of PCT International Search Report).

*Primary Examiner* — Srinivas Sathiraju
(74) *Attorney, Agent, or Firm* — Fenwick & West LLP

(57) ABSTRACT

There is provided a plasma processing method in a plasma processing apparatus including a chamber, a stage on which a substrate is placed in the chamber, a plurality of radiating devices configured to radiate a plurality of electromagnetic waves, and a dielectric window disposed between the plurality of radiating devices and the stage. The method comprises: preparing the substrate on the stage; controlling a phase of at least one of the plurality of electromagnetic waves radiated from the plurality of radiating devices; radiating the plurality of electromagnetic waves into the chamber from the plurality of radiating devices; and processing the substrate using localized plasma generated from a gas supplied between the dielectric window and the stage.

9 Claims, 8 Drawing Sheets

(58) Field of Classification Search
CPC .......... H01J 37/32009; H01J 37/32532; C23C 16/507; C23C 16/509; C23C 16/5096; C23C 16/45565; H01L 21/67069
USPC ...................................................... 118/723 R
See application file for complete search history.

(56) References Cited

U.S. PATENT DOCUMENTS

| | | | | |
|---|---|---|---|---|
| 6,140,773 | A * | 10/2000 | Anders | H05H 1/466 315/111.21 |
| 6,313,584 | B1 * | 11/2001 | Johnson | H01J 37/32183 315/111.21 |
| 6,527,908 | B2 * | 3/2003 | Kanetsuki | H01J 37/32192 118/723 MW |
| 6,780,278 | B2 * | 8/2004 | Hayashi | H01J 37/32532 156/345.47 |
| 8,525,412 | B2 * | 9/2013 | Espiau | H01J 65/044 315/39 |
| 8,773,018 | B2 * | 7/2014 | Hensley | H05H 1/2406 315/111.41 |
| 8,988,012 | B2 * | 3/2015 | Yoshikawa | H01J 37/32192 315/39 |
| 9,159,536 | B2 * | 10/2015 | Kaneko | H01J 37/32183 |
| 9,734,990 | B2 * | 8/2017 | Chang | H05H 1/46 |
| 9,767,993 | B2 * | 9/2017 | Ishibashi | H01J 37/32495 |
| 10,074,524 | B2 * | 9/2018 | Kaneko | H01J 37/3405 |
| 10,529,541 | B2 * | 1/2020 | Lai | C23C 16/5096 |
| 10,957,518 | B2 * | 3/2021 | Ramaswamy | H01J 37/32568 |
| 11,694,911 | B2 * | 7/2023 | Yang | H01J 37/32724 156/345.34 |
| 11,749,511 | B2 * | 9/2023 | Yamazaki | H01J 37/32449 156/345.26 |
| 2003/0052085 | A1 * | 3/2003 | Parsons | H01J 37/32082 118/712 |
| 2008/0050292 | A1 * | 2/2008 | Godyak | H01J 37/321 422/186.29 |
| 2010/0175832 | A1 * | 7/2010 | Nishio | H01J 37/321 156/345.49 |
| 2010/0175833 | A1 * | 7/2010 | Nishio | H01J 37/3266 156/345.49 |
| 2010/0230053 | A1 * | 9/2010 | Nishio | H01J 37/32678 156/345.49 |
| 2011/0061814 | A1 * | 3/2011 | Ikeda | H01J 37/32192 315/111.21 |
| 2011/0284167 | A1 * | 11/2011 | Nishio | H01J 37/3266 156/345.35 |
| 2015/0013907 | A1 * | 1/2015 | Fujii | H01J 37/3222 315/111.21 |
| 2015/0013911 | A1 * | 1/2015 | Iwao | H01J 37/32522 156/345.37 |
| 2015/0015139 | A1 * | 1/2015 | Kaneko | H01J 37/3299 315/34 |
| 2015/0194290 | A1 * | 7/2015 | Nozawa | H05H 1/46 118/723 AN |
| 2015/0214011 | A1 * | 7/2015 | Kaneko | H01J 37/32119 315/111.21 |
| 2017/0110289 | A1 * | 4/2017 | Nishio | H01J 37/32651 |
| 2018/0179626 | A1 * | 6/2018 | Inglis | C23C 16/463 |
| 2019/0075644 | A1 * | 3/2019 | Ikeda | C23C 16/511 |
| 2020/0161099 | A1 * | 5/2020 | Park | H01J 37/32834 |
| 2021/0125814 | A1 * | 4/2021 | Sato | H01J 37/3222 |
| 2021/0151326 | A1 * | 5/2021 | Shimizu | H01L 21/31116 |
| 2021/0225612 | A1 * | 7/2021 | Kamata | H05H 1/46 |
| 2021/0225623 | A1 * | 7/2021 | Yamazaki | H01J 37/32449 |
| 2021/0249240 | A1 * | 8/2021 | Itoh | H01J 37/32504 |
| 2022/0199369 | A1 * | 6/2022 | Kamata | H05H 1/46 |
| 2023/0326716 | A1 * | 10/2023 | Kamata | H01J 37/32238 315/111.01 |

FOREIGN PATENT DOCUMENTS

| | | | | |
|---|---|---|---|---|
| JP | 2018-181634 | A | 11/2018 | |
| JP | 2021044201 | A * | 3/2021 | ............ C23C 16/04 |
| WO | WO-2011040328 | A1 * | 4/2011 | ........ H01J 37/32192 |
| WO | WO-2013102964 | A1 * | 7/2013 | ........ H01L 23/5223 |

* cited by examiner (a)

(b)

(a)

(b)

$$\delta(x) = k\left(\sqrt{x^2 + z^2} - z\right)$$

PLASMA PROCESSING METHOD AND PLASMA PROCESSING APPARATUS

TECHNICAL FIELD

The present disclosure relates to a plasma processing method and a plasma processing apparatus.

BACKGROUND

There is known a plasma processing apparatus for forming plasma of a gas by a power of electromagnetic waves and performing plasma processing on a wafer. For example, Patent Document 1 discloses a plasma processing apparatus including a processing chamber for forming plasma, a vacuum window forming a part of a wall of the processing chamber, induction antennas disposed outside a dielectric of the vacuum window and including at least two systems for forming plasma in the processing chamber, radio frequency power supplies for making currents flow in the induction antennas independently, and a control unit including phase circuits, a controller, or the like for controlling phases of the currents or current values of the radio frequency power supplies of the respective systems over time. The control unit of Patent Document 1 continuously performs time modulation of a phase difference between the currents flowing in the systems or the current values within a sample processing period and moves a plasma generation position to make an incident angle of ions on a wafer uniform in a wafer plane.

For example, Patent Document 2 suggests a method for modifying a reaction rate on a semiconductor substrate in a processing chamber using a phased-array microwave antenna. This method includes: exciting plasma in the processing chamber; emitting microwave radiation beam from the phased-array microwave antenna; and directing the beam to the plasma to change the reaction rate on a surface of the semiconductor substrate in the processing chamber.

For example, Patent Document 3 suggests an apparatus for radiating microwaves outputted from a microwave output unit into a chamber from an antenna and generating an electric field for generating surface wave plasma in a dielectric member that transmits the microwaves radiated from the antenna. In Patent Document 3, at least one of the power and the phase of the microwaves radiated to a microwave radiation mechanism is controlled based on an electron temperature Te of the plasma and an electron density Ne of the plasma.

Patent Document 1: Japanese Patent Application Publication No. 2015-53172
Patent Document 2: Japanese Patent Application Publication No. 2017-103454
Patent Document 3: Japanese Patent Application Publication No. 2018-181634

SUMMARY

The present disclosure provides a plasma processing method and a plasma processing apparatus capable of changing electric field distribution in a dielectric window regardless of arrangement of a plurality of electromagnetic wave radiating devices.

In accordance with one aspect of the present disclosure, there is provided a plasma processing method in a plasma processing apparatus including a chamber, a stage on which a substrate is placed in the chamber, a plurality of radiating devices configured to radiate a plurality of electromagnetic waves, and a dielectric window disposed between the plurality of radiating devices and the stage. The method comprises preparing the substrate on the stage, controlling a phase of at least one of the plurality of electromagnetic waves radiated from the plurality of radiating devices, radiating the plurality of electromagnetic waves into the chamber from the plurality of radiating devices, and processing the substrate using localized plasma generated from a gas supplied between the dielectric window and the stage.

Effect of the Invention

In accordance with one aspect, it is possible to change the electric field distribution in the dielectric window regardless of the arrangement of the electromagnetic wave radiating devices.

DETAILED DESCRIPTION

Figure 1A:
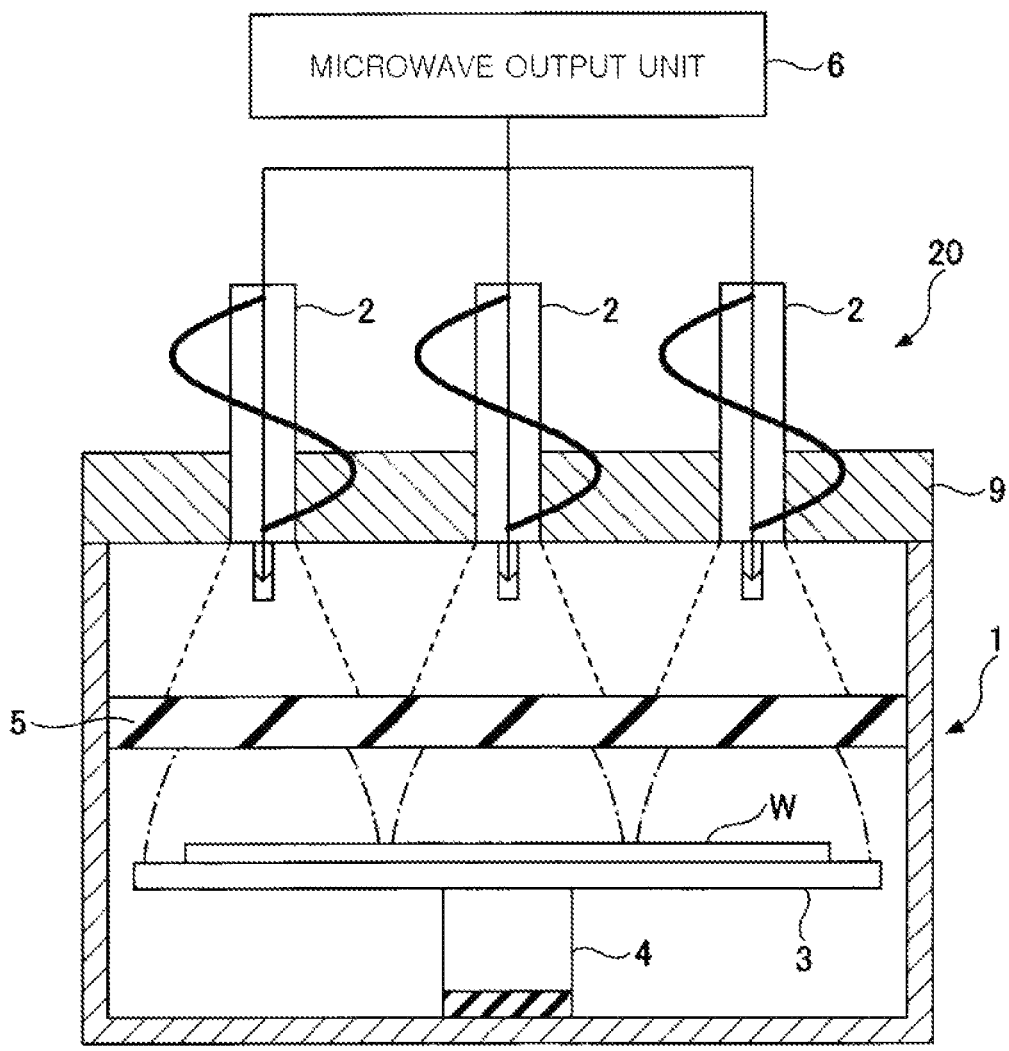
FIG. 1A is a schematic cross-sectional view showing an example of a plasma processing apparatus according to a comparative example.
Figure 1A:
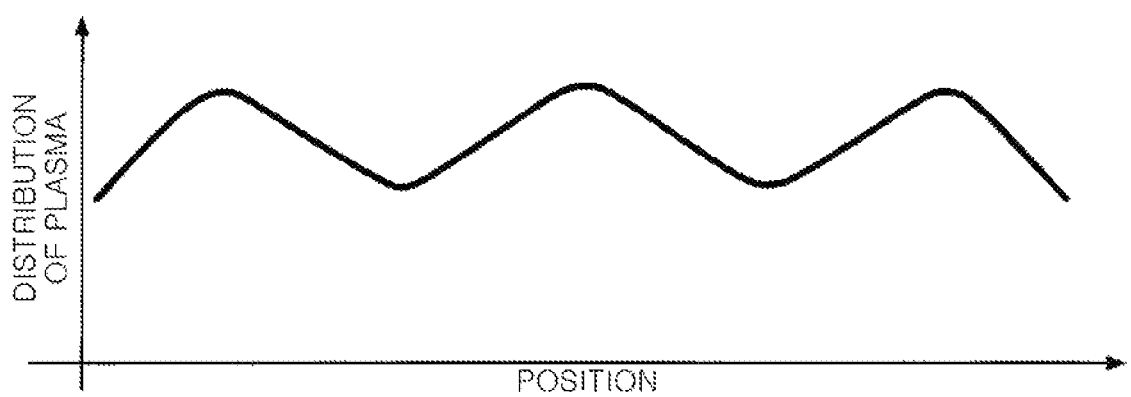

Hereinafter, embodiments will be described in detail with reference to the accompanying drawings. Like reference numerals will be given to like parts throughout the drawings, and redundant description thereof may be omitted.

(Plasma Processing Apparatus)

Figure 1B:
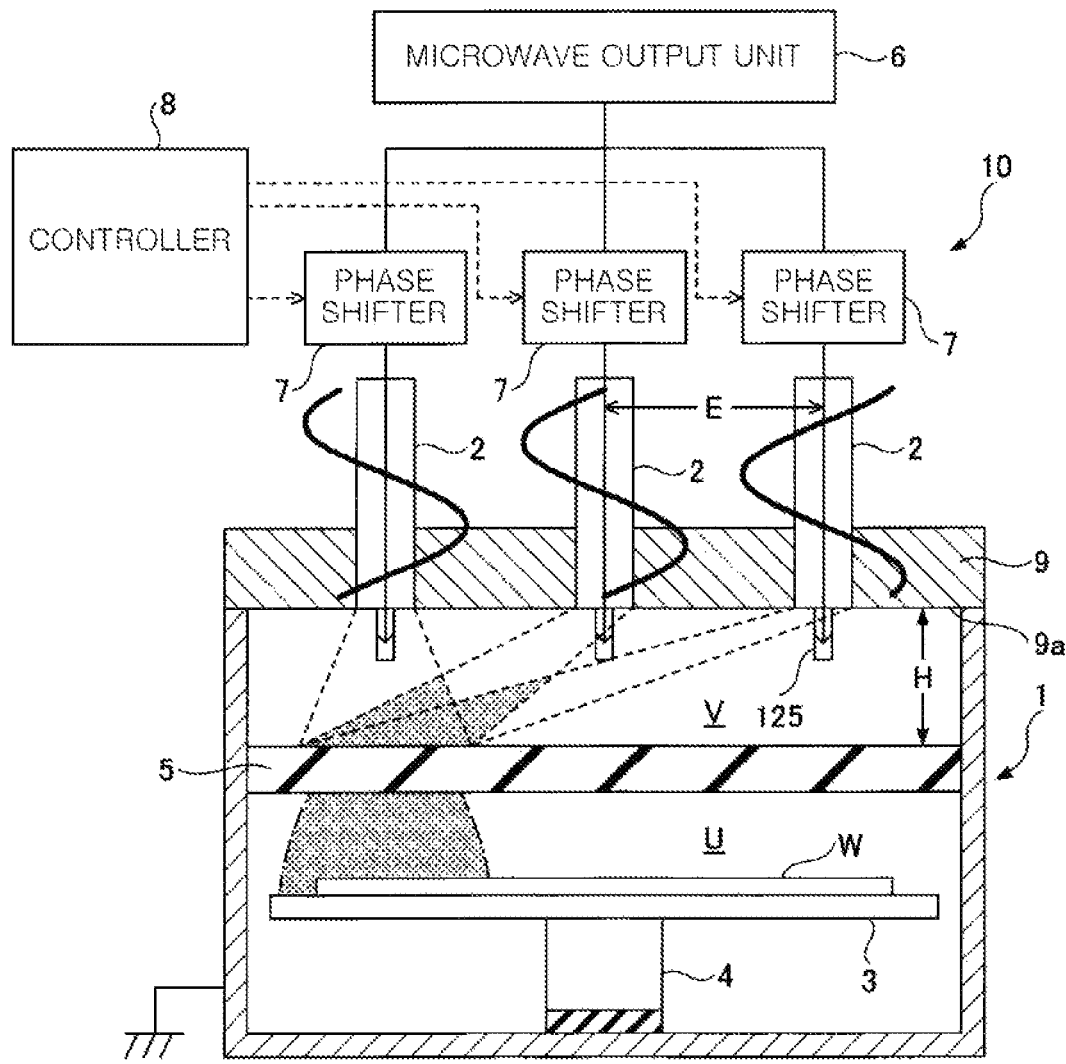
FIG. 1B is a schematic cross-sectional view showing an example of a plasma processing apparatus according to an embodiment.
Figure 1B:
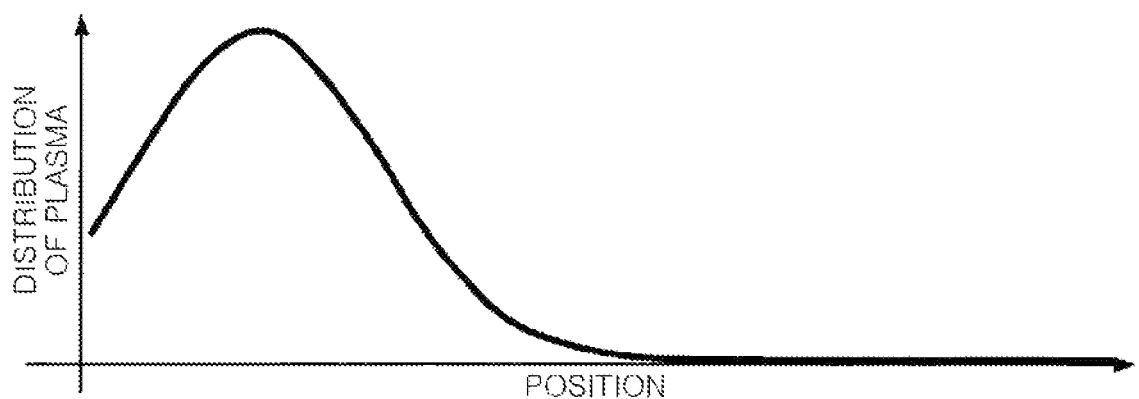

A plasma processing apparatus 10 according to the embodiment will be described with reference to FIGS. 1A and 1B. FIG. 1A is a schematic cross-sectional view showing an example of a plasma processing apparatus 20 according to a comparative example, and FIG. 1B is a schematic cross-sectional view showing an example of the plasma processing apparatus 10 according to an embodiment. A microwave plasma processing apparatus will be described as an example of the plasma processing apparatuses 10 and 20. The plasma processing apparatus 20 according to the comparative example shown in part (a) of FIG. 1A does not include a phase shifter.

The plasma processing apparatus 10 according to an embodiment shown in part (a) of FIG. 1B includes a chamber 1 accommodating a wafer W. The plasma processing apparatus 10 performs predetermined plasma processing such as film formation, etching, or the like on the wafer W using surface wave plasma generated by microwaves.

The chamber 1 is a substantially cylindrical processing container and is grounded. The inside of the chamber 1 can be maintained in an airtight state by closing an upper opening formed at a ceiling portion of the chamber 1 with a ceiling plate 9. The chamber 1 and the ceiling plate 9 are made of a metal material such as aluminum, stainless steel, or the like.

A stage 3 on which the wafer W is placed is supported at a bottom center of the chamber 1 by a cylindrical support member 4 extending upward through an insulating member. The stage 3 may be made of, e.g., a metal such as aluminum having an alumite-treated (anodically oxidized) surface, or may be made of an insulating member (ceramic or the like) having therein a radio frequency electrode. The stage 3 may be provided with an electrostatic chuck for attracting and holding the wafer W, a temperature control mechanism, a gas flow path for supplying a heat transfer gas to the backside of the wafer W, and the like.

Further, a radio frequency bias power supply may be electrically connected to the stage 3 through a matcher. By supplying a radio frequency power from the radio frequency bias power supply to the stage 3, ions in the plasma are attracted toward the wafer W. However, the radio frequency bias power supply may not be provided depending on characteristics of plasma processing.

An exhaust line is connected to the bottom portion of the chamber 1. An exhaust including a vacuum pump is connected to the exhaust line. When the exhaust is driven, a gas in the chamber 1 is exhausted and a pressure in the chamber is reduced to a predetermined degree of vacuum. A loading/unloading port for loading and unloading the wafer W and a gate valve for opening and closing the loading/unloading port are disposed on a sidewall of the chamber 1.

The ceiling plate 9 is provided with seven electromagnetic wave radiating devices 2 for radiating microwaves into the chamber 1 (only three electromagnetic wave radiating devices 2 are shown in part (a) of FIG. 1B).

(Monopole Antenna)

Figure 2:
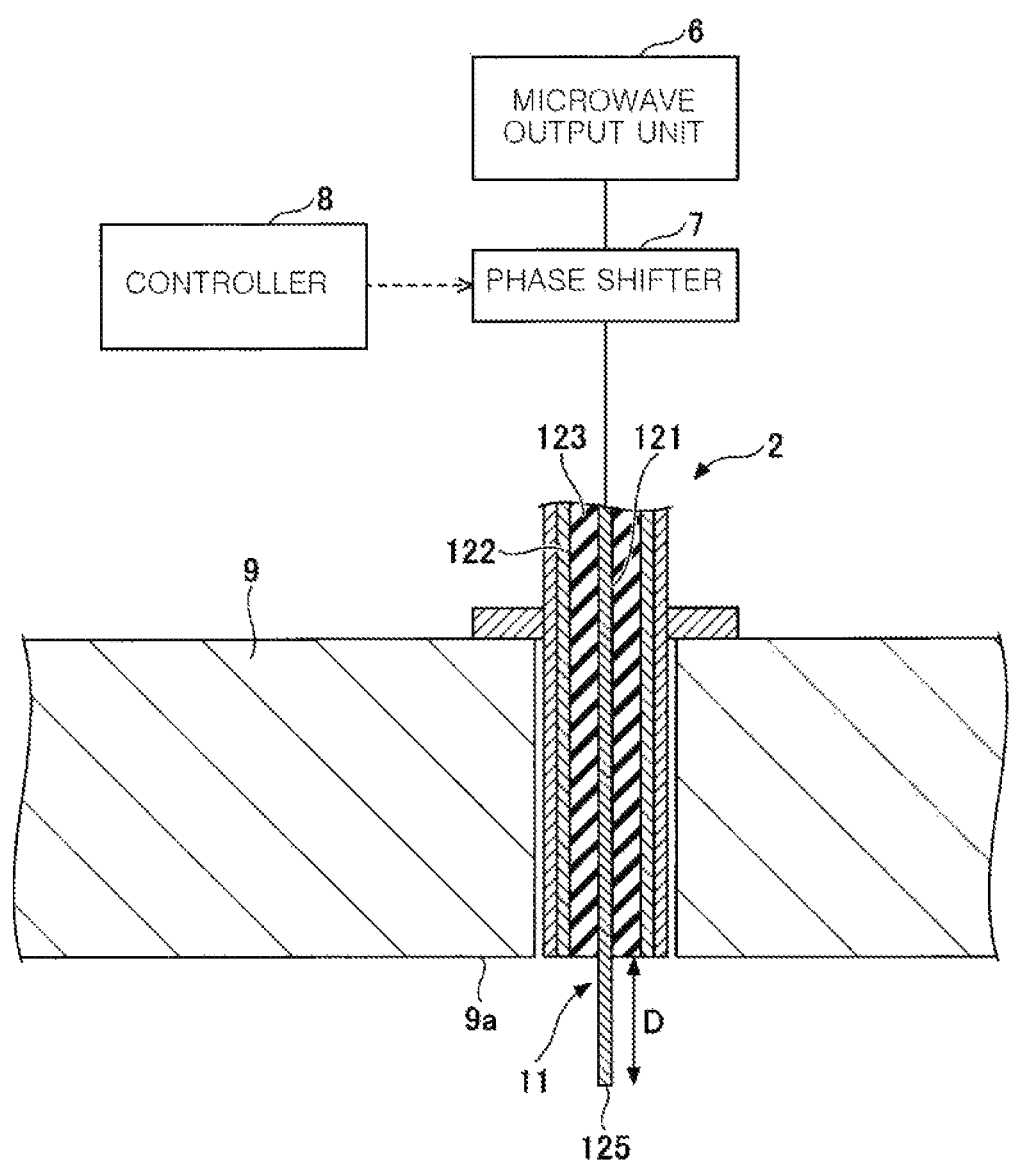
FIG. 2 shows an example of an electromagnetic wave radiating device according to an embodiment.

FIG. 2 shows an example of the electromagnetic wave radiating device 2. The electromagnetic wave radiating device 2 has a coaxial cable shape, and includes an inner conductor 121, an outer conductor 122 disposed on an outer side of the inner conductor 121, and a dielectric 123 such as Teflon (Registered Trademark) or the like disposed between the inner conductor 121 and the outer conductor 122. A tip end of the electromagnetic wave radiating device 2 constitutes a monopole antenna 11 formed of the inner conductor 121 projecting by a length D.

The monopole antenna 11 constitutes a radiating device 125 by exposing the inner conductor 121 from the end surface of the dielectric 123 at the same height as that of a back surface 9a of the ceiling plate 9 of the chamber 1 into the inner space of the chamber 1, so that the microwaves are radiated from the radiating device 125 into the chamber 1. The length D of the radiating device 125 varies depending on the frequency of the electromagnetic wave. For example, when the frequency of the microwave is 300 MHz to 3 GHz, the length D is several tens of mm to several hundreds of mm. However, the inner conductor 121 may not project from the dielectric 123. In this case, a notch portion in which the outer conductor 122 is not disposed is formed at the tip end of the electromagnetic wave radiating device 2, and the microwaves are radiated into the chamber 1 from a radiation port at the tip end of the inner conductor 121 through the notch portion.

With this configuration, the microwaves are outputted from a microwave output unit 6 and radiated into the chamber 1 after the phases thereof are controlled by a phase shifter 7 under the control of a controller 8. The number of the electromagnetic wave radiating devices 2 is not limited to seven, and may be two or more, preferably three or more.

Referring back to part (a) of FIG. 1B, the electromagnetic wave radiating devices 2 are arranged at approximately equal intervals such that a distance E between centers of two adjacent electromagnetic wave radiating devices 2 becomes smaller than ½ of a wavelength A of the microwave. A dielectric window 5 is disposed so as to be separated from a plurality of radiating devices 125 and the stage 3. The dielectric window 5 is a partition plate that divides the inside of the chamber 1 into a space V above the dielectric window 5 and a space U below the dielectric window 5. The dielectric window 5 is made of, e.g., ceramics such as quartz and alumina ($Al_2O_3$), a fluorine-based resin such as polytetrafluoroethylene or the like, or a polyimide-based resin.

A free space of about several tens of mm to several hundreds of mm exists in the space V below the electromagnetic wave radiating device 2, and plasma is generated in the space U through the dielectric window 5 disposed below the free space. A vertical distance H between the back surface 9a of the ceiling plate 9 and the upper surface of the dielectric window 5 is greater than $\lambda/4$ with respect to the wavelength A of the microwave. A plurality of microwaves radiated from the seven electromagnetic wave radiating devices 2 propagate in the space V. The space V is an atmospheric space, and the space U is a vacuum space.

The plasma processing apparatus 10 includes the controller 8. The controller 8 may be a computer including a processor, a storage such as a memory or the like, an input device, a display device, a signal input/output interface, and the like. The controller 8 controls individual components of the plasma processing apparatus 10. In the controller 8, an operator can input a command to manage the plasma processing apparatus 10 using the input device. Further, in the controller 8, an operation status of the plasma processing apparatus 10 can be visualized and displayed by the display device. Further, a control program and recipe data are stored in the storage. The control program is executed by the processor to execute various processes in the plasma processing apparatus 10. The processor executes the control program and controls the individual components of the plasma processing apparatus 10 based on the recipe data. Further, the processor of the controller 8 controls the phase shifter 7 provided for each electromagnetic wave radiating device 2 and controls the phases of the microwaves radiated from the radiating device 125.

In the case of performing plasma processing in the plasma processing apparatus 10 configured as described above, first, the wafer W held on a transfer arm is loaded into the chamber 1 from an open gate valve through the loading/unloading port.

The gate valve is closed after the wafer W is loaded. When the wafer W is transferred to a position above the stage 3, the wafer W is delivered from the transfer arm to a pusher pin, and is placed on the stage 3 by lowering the pusher pin. The pressure in the chamber 1 is maintained at a predetermined degree of vacuum by the exhaust. A predetermined gas is introduced into the space U below the dielectric window 5. The phase-controlled microwaves are radiated from the seven electromagnetic wave radiating devices 2 (the monopole antennas 11). Accordingly, the electric field becomes strong at a predetermined position of the dielectric window 5, and the distribution of the plasma of the gas can be controlled. Predetermined plasma processing is performed on the wafer W by the generated plasma.

In the plasma processing apparatus 20 according to the comparative example shown in part (a) of FIG. 1A, the phases of the microwaves radiated from the seven electromagnetic wave radiating devices 2 are the same, as indicated by thick curved lines in the electromagnetic wave radiating devices 2. Therefore, in the plasma processing apparatus 20 according to the comparative example, when the plasma is generated below the dielectric window 5 by the microwave electric field, the electric field distribution is affected by the arrangement pattern of the seven electromagnetic wave radiating devices 2. As a result, as shown in part (b) of FIG. 1A, the plasma distribution varies depending on the arrangement pattern of the electromagnetic wave radiating devices 2. In other words, the plasma processing on the wafer W tends to be non-uniform due to the influence of the arrangement pattern of the electromagnetic wave radiating devices 2.

However, it is difficult to change the arrangement pattern of the electromagnetic wave radiating devices 2, which is the physical arrangement, from the preset arrangement. Therefore, the plasma processing apparatus 10 and the plasma processing method of the present embodiment can control the plasma distribution by changing the electric field distribution in the dielectric window 5 regardless of the arrangement of the electromagnetic wave radiating devices 2.

In other words, in the plasma processing apparatus 10 according to the present embodiment shown in part (a) of FIG. 1B, the phases of the microwaves radiated from the seven electromagnetic wave radiating devices 2 are controlled using the phase shifters 7 under the control of the controller 8. Accordingly, the microwaves inputted from the seven electromagnetic wave radiating devices 2 interfere, and the electric field can be strengthened at a certain position. Hence, the plasma distribution can be controlled with high accuracy by concentrating the plasma.

For example, in part (a) of FIG. 1B, the microwaves propagating in the space V interfere due to the phase control of the microwaves inputted from the seven electromagnetic wave radiating devices 2, so that the strength of the microwave electric field becomes strong on a left side of the dielectric window 5. Thus, it is possible to concentrate plasma on a left side of the wafer W, as shown in part (b) of FIG. 1B.

(Phase Control)

Figure 3A:
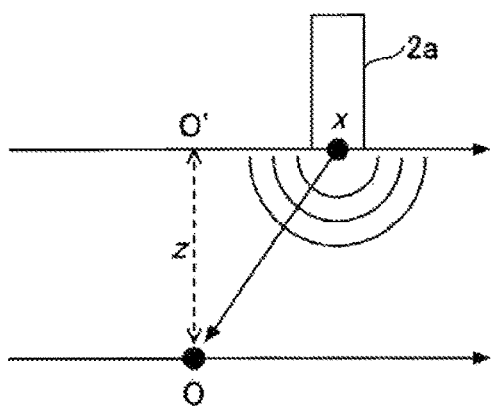
FIG. 3 explains phase control according to an embodiment.
Figure 3B:
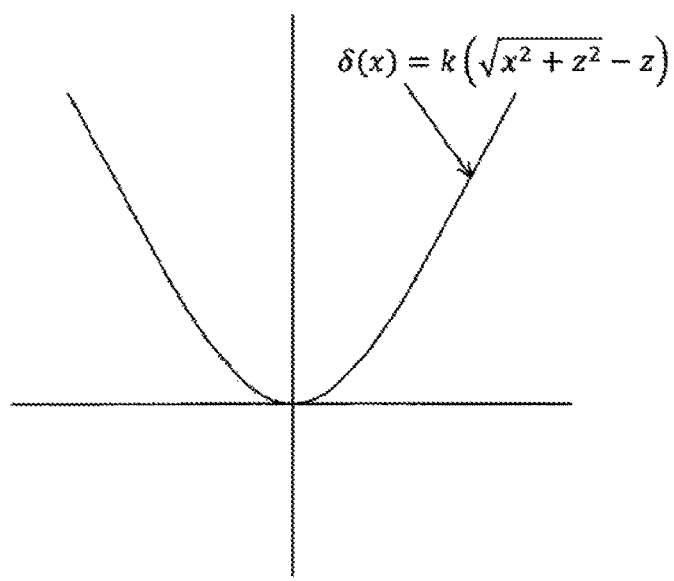
Figure 3C:
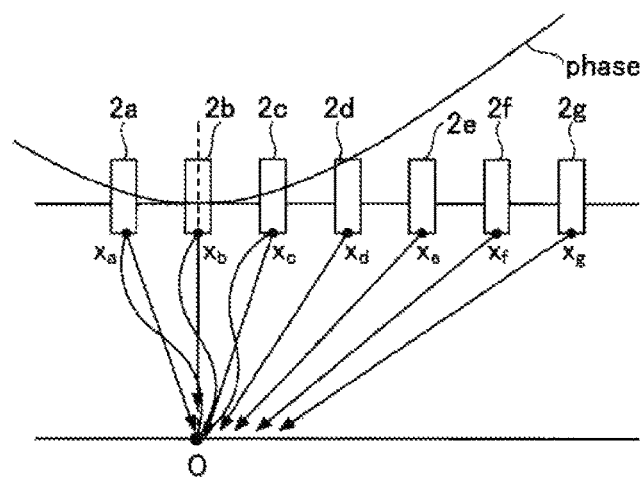

Next, the microwave phase control will be described with reference to FIGS. 3A to 3C. FIGS. 3A to 3C explain the phase control using the phase shifter 7 performed by the controller 8 of the plasma processing apparatus 10 according to one embodiment. FIG. 3A shows the relationship between the microwaves radiated from one of the electromagnetic wave radiating devices 2 (an electromagnetic wave radiating device 2a in this example) and a focal position O at which the electric field should be concentrated in the dielectric window 5. The following Eq. (1) is satisfied when the position on the back surface of the ceiling plate 9 perpendicular to the focal position O is set to O'; the distance from the focal position O to the position O' on the back surface of the ceiling plate 9 is set to z; and the radiation position of the microwaves radiated from the electromagnetic wave radiating device 2a is set to x.

[Eq. 1]

$$k\sqrt{x^2+z^2}-\delta(x)=kz \quad (1)$$

K in Eq. (1) indicates a wave number of an electromagnetic wave and is represented by a reciprocal of the wavelength λ of the electromagnetic wave, i.e., k=1/λ. δ(x) indicates the phase of the electromagnetic wave (microwave in the present embodiment) radiated from the radiation position x.

Eq. (2) for obtaining the phase δ(x) of the electromagnetic wave is obtained by transforming Eq. (1).

[Eq. 2]

$$\delta(x)=k(\sqrt{x^2+z^2}-z) \quad (2)$$

Based on Eq. (2), the phase δ(x) of the electromagnetic wave radiated from the radiation position x is calculated from the wave number k of the electromagnetic wave, the distance z from the position O on the dielectric window 5 to the position O' on the back surface of the ceiling plate 9, and the radiation position x. Eq. (2) is expressed by the curve of FIG. 3B.

The conditions for strengthening the phases of the microwaves radiated from two or more electromagnetic wave radiating devices 2 at the focal position O will be described with reference to FIG. 3C. The seven electromagnetic wave radiating devices 2 include electromagnetic wave radiating devices 2a, 2b, 2c, 2d, 2e, 2f, and 2g. In FIG. 3C, for convenience of description, they are arranged horizontally while being spaced apart from each other unlike the actual positional relationship of the electromagnetic wave radiating devices 2.

In the case of controlling the electromagnetic wave radiating devices 2a to 2g according to the present embodiment, the controller 8 controls phases $\delta(x_a)$ to $\delta(x_g)$ of the microwaves radiated from the electromagnetic wave radiating devices 2a to 2g to be matched at the focal position O in the respective distances from radiation positions $x_a$ to $x_g$ of the microwaves radiated from the electromagnetic wave radiating devices 2a to 2g to the focal position O.

Since the radiation positions x of the electromagnetic wave radiating devices 2a to 2g are different, as shown in Eq. (2), the phases δ(x) of the microwaves radiated from the electromagnetic wave radiating devices 2a to 2g are different from each other at the focal position O if the phase control is not performed. Accordingly, even if any of the microwaves radiated from the electromagnetic wave radiating devices 2a to 2g is in a condition of strengthening the phases at the focal position O, any of the other microwaves is in a condition of weakening the phases at the focal position O. On the other hand, in the present embodiment, the phases of all the microwaves can be strengthened at the focal position O by controlling the phases $\delta(x_a)$ to $\delta(x_g)$ of the microwaves radiated from the electromagnetic wave radiating devices 2a to 2g, respectively. For example, the phases of the microwaves radiated from the electromagnetic wave radiating devices 2a, 2b, and 2c shown in FIG. 3C are in a condition of strengthening the phase of the microwave because antinodes coincide with each other, and nodes coincide with each other. However, even if it is controlled to strengthen the phases of the microwaves radiated from the electromagnetic wave radiating devices 2a, 2b, and 2c, the phase of at least one microwave radiated from the electromagnetic wave radiating devices 2d to 2g may be weakened. In other words, all the phases of the seven microwaves may not be strengthened at the focal position O.

On the other hand, in the present embodiment, the phases of the microwaves radiated from the electromagnetic wave radiating devices 2d, 2e, 2f, and 2g are also controlled under a condition of strengthening the microwaves. Accordingly, the phase of each microwave is controlled under a condition that the phases of the seven microwaves are strengthened at the focal position O on the dielectric window 5, which makes it possible to control the microwave electric field to be concentrated at the focal position O.

However, the control for strengthening the phases of the microwaves at the focal position O is performed on two microwaves having the lowest phase outputted from the electromagnetic wave radiating devices $2a$ to $2g$, and may not be performed on all the seven microwaves. For example, the phases of the microwaves of one or more electromagnetic wave radiating devices 2 may not be controlled. In the above description, one focal position O exists on the dielectric window 5. However, the present disclosure is not limited thereto, and it is also possible to perform the control for strengthening the phases at two or more focal positions O on the dielectric window 5 at the same timing.

As shown in part (a) of FIG. 1B, the distance E from the center of one electromagnetic wave radiating device 2 to the center of an adjacent electromagnetic wave radiating device 2 is smaller than $\lambda/2$. If the distance E (interval) between the adjacent electromagnetic wave radiating devices 2 is greater than $\lambda/2$, the microwaves cannot be concentrated at the focal position O on the dielectric window 5, and it is not possible to perform the control of strengthening the phases of the microwaves at the focal position O.

The concentration of microwaves by the phase control described above does not require a mechanical operation, and thus can be controlled at a high speed. In principle, it is possible to move the focal position O over time with high-speed control comparable to the microwave frequency. Accordingly, the phase control of the electromagnetic wave radiating devices 2 can be performed at a high speed. As a result, plasma can be uniformly formed in the space U below the dielectric window 5 by controlling the distribution of the microwave electric field in the dielectric window 5 at a high speed.

Figure 4:
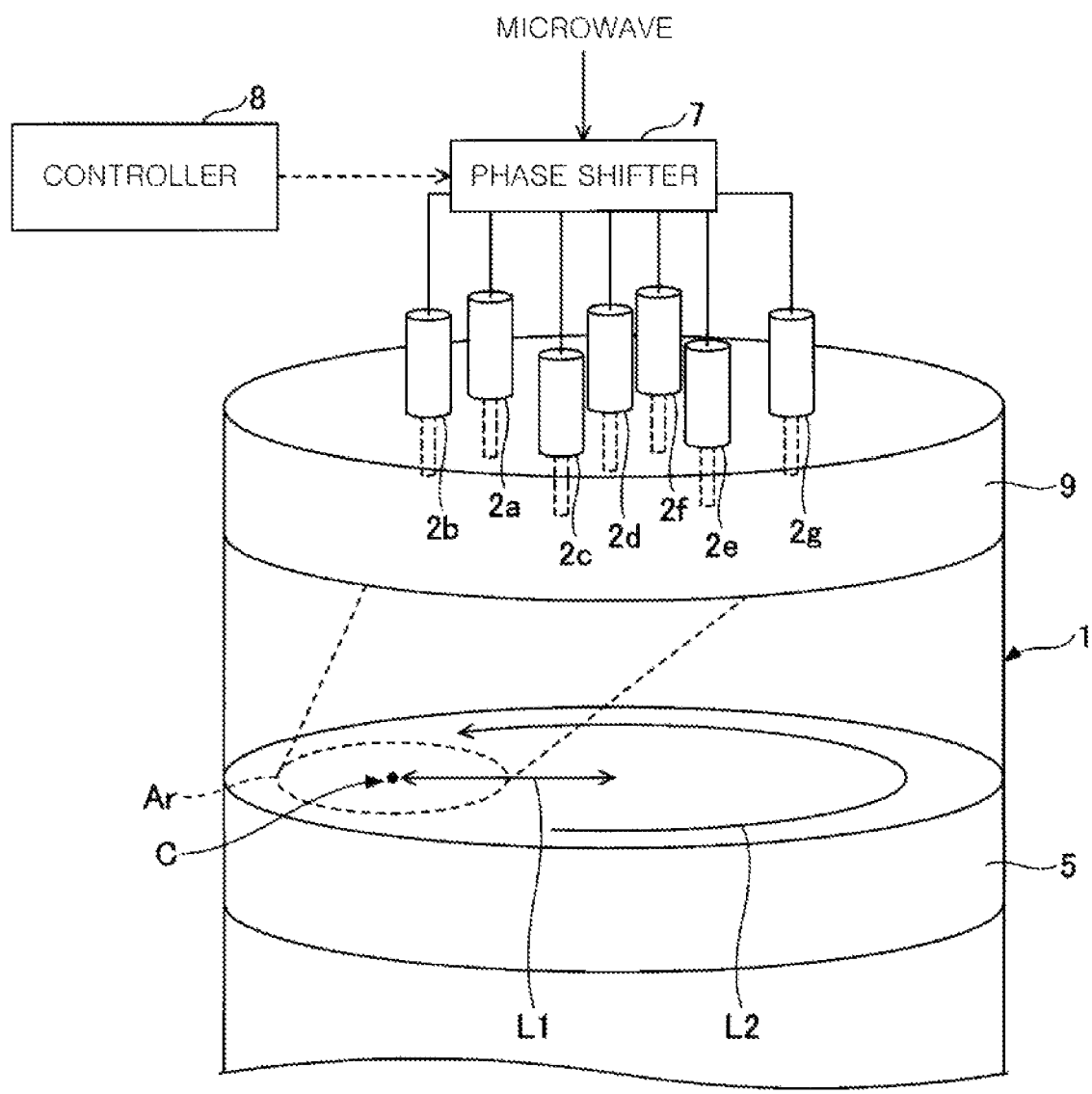
FIG. 4 shows an example of phase control performed by a controller according to an embodiment.

FIG. 4 shows an example of the phase control performed by the controller 8 according to an embodiment. In the example of FIG. 4, the controller 8 uses the phase shifters (only one is shown in FIG. 4) to control the phases $\delta(x_a)$ to $\delta(x_g)$ of the microwaves radiated from the seven electromagnetic wave radiating devices $2a$ to $2g$ to be strengthened at the focal position C. Thereby, it is schematically shown that the microwave electric field is controlled to be strengthened at a focusing portion Ar centered on the focal position C.

The controller 8 uses the phase shifters 7 to control the microwave phases $\delta(x_a)$ to $\delta(x_g)$ at a high speed such that the focal position C scans the surface of the dielectric window 5 in a radial direction L1 or in a circumferential direction L2. Accordingly, plasma can be uniformly formed in the space U below the dielectric window 5 by moving the focal position C and the focusing portion Ar at a high speed.

Further, the controller 8 changes the moving speed of the focusing portion Ar by changing the speed of controlling the phases $\delta(x_a)$ to $\delta(x_g)$ of the microwaves using the phase shifters 7. Accordingly, average electric field distribution per unit time can be freely controlled. For example, the controller 8 may change the speed of controlling the phases $\delta(x_a)$ to $\delta(x_g)$ of the microwaves such that the focusing portion Ar moves slowly on an outer peripheral side of the dielectric window 5 and moves faster on an inner peripheral side of the dielectric window 5. Hence, the electric field strength on the outer peripheral side of the dielectric window 5 can become stronger than that on the inner peripheral side of the dielectric window 5. As a result, the plasma distribution can be freely controlled such as controlling the plasma density on the outer peripheral side below the dielectric window 5 to be higher than the plasma density on the inner peripheral side.

(Plasma Processing Method)

Figure 5:
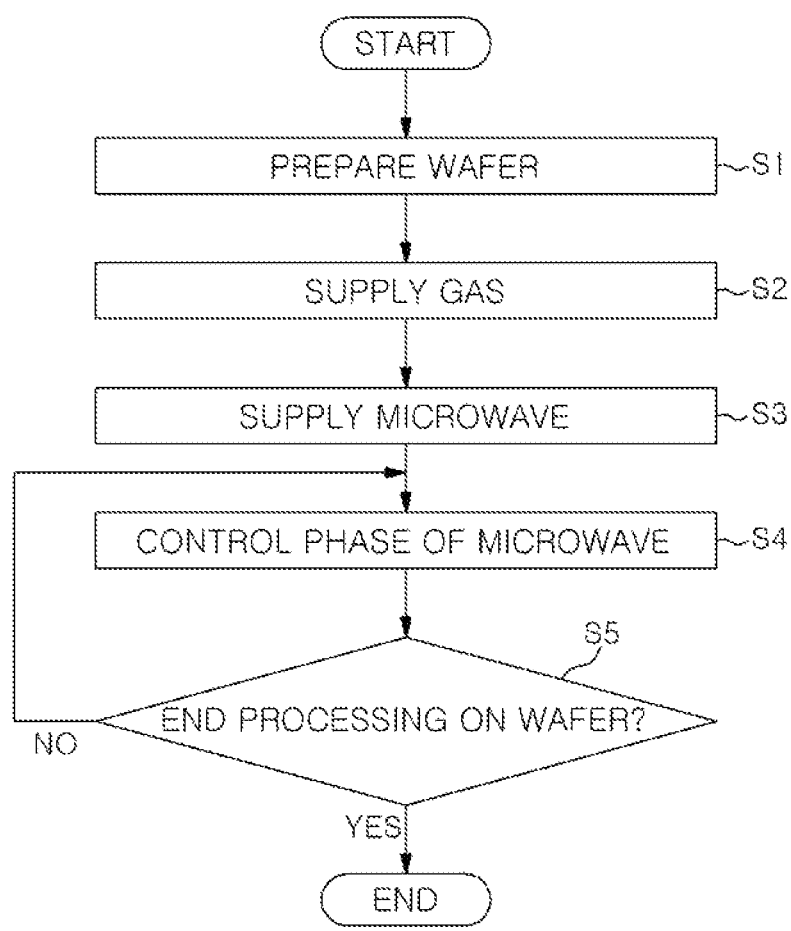
FIG. 5 is a flowchart showing an example of a plasma processing method according to an embodiment.

Next, an example of the plasma processing method performed by the plasma processing apparatus 10 will be described with reference to FIG. 5. FIG. 5 is a flowchart showing an example of the plasma processing method according to an embodiment. This processing is controlled by the controller 8.

When this processing is started, the controller 8 prepares the wafer W by loading the wafer W into the chamber and placing it on the stage 3 (step S1). Next, the controller 8 supplies a predetermined gas from a gas supply (step S2). Next, the controller 8 outputs microwaves from the microwave output unit 6 (step S3).

Next, the controller 8 uses the phase shifters 7 to control the phases of the microwaves radiated from the seven electromagnetic wave radiating devices 2, and radiates the phase-controlled microwaves from the radiating devices 125 of the electromagnetic wave radiating devices 2 into the chamber (step S4). Accordingly, the phase-controlled microwaves interfere with each other in the space V, and the microwaves can be concentrated at a predetermined position on the dielectric window 5. Hence, localized plasma is formed in the space U between the dielectric window 5 and the stage 3, and predetermined plasma processing is performed on the wafer W using the formed localized plasma.

Next, the controller 8 determines whether to end the plasma processing on the wafer W (step S5). The controller 8 controls the phases of the microwaves outputted from the seven electromagnetic wave radiating devices 2 over time until it is determined to end the plasma processing on the wafer W based on the recipe (step S4). The controller 8 ends this processing when it is determined to end the plasma processing on the wafer W based on the recipe. When this processing is ended, the microwave output is stopped, and the gas supply is stopped.

(Phase Control Simulation Result)

Figure 6A:
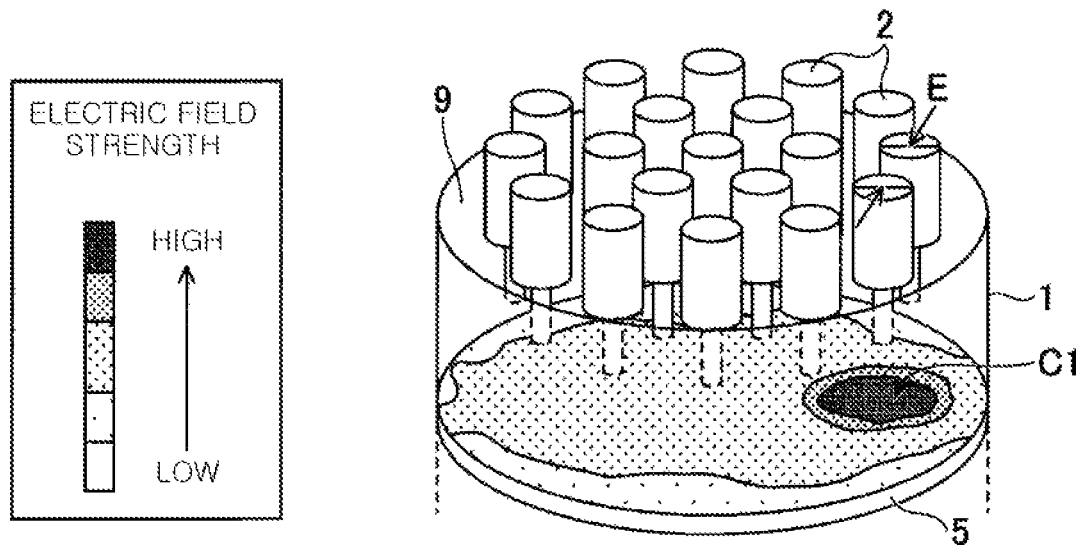
FIGS. 6A to 6C show examples of electric field distribution in a dielectric window according to an embodiment.
Figure 6B:
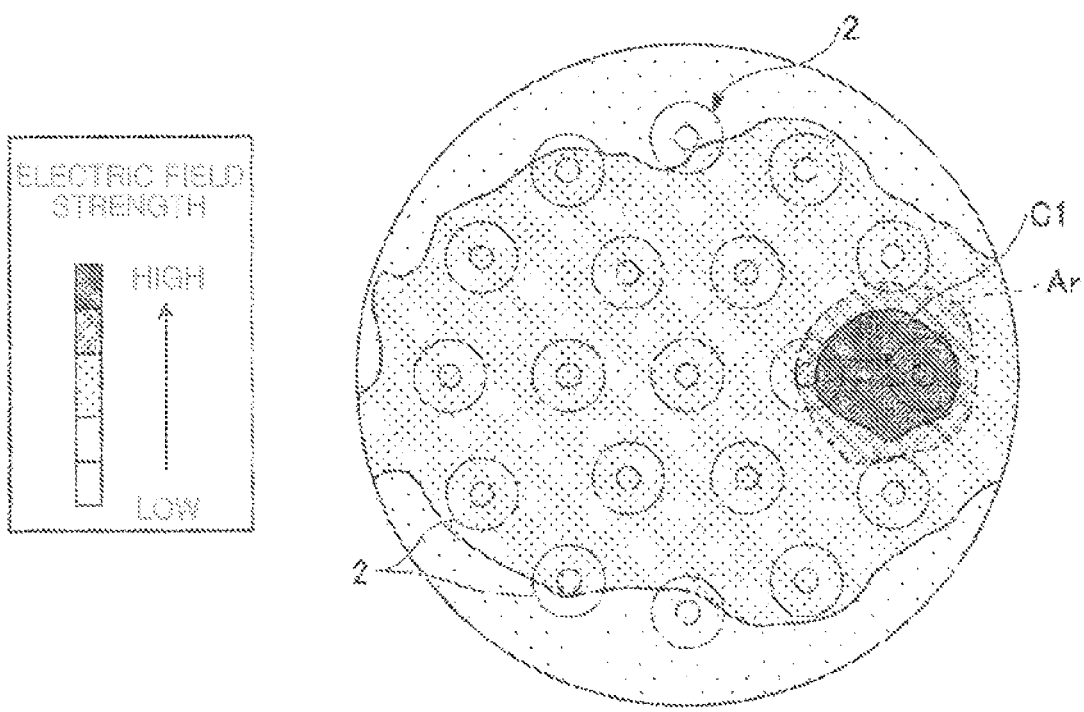
Figure 6C:
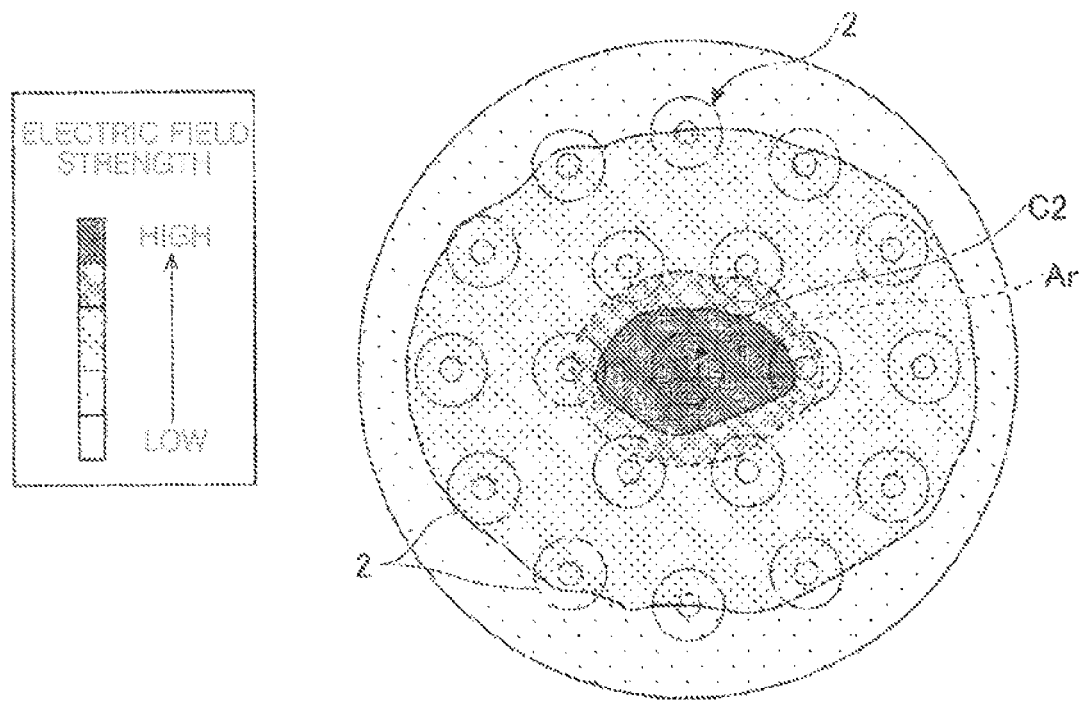

FIGS. 6B and 6C show examples of the simulation result of the electric field distribution in the dielectric window 5 according to an embodiment in the case where the controller 8 controls the phases of the microwaves outputted from nineteen electromagnetic wave radiating devices 2 using the phase shifters 7 as shown in FIG. 6A.

This simulation was performed under the condition of radiating microwaves of the same power from the nineteen electromagnetic wave radiating devices 2. In FIGS. 6A, 6B and 6C, darker portions indicate higher electric field strength of microwaves.

In the case of controlling the phases $\delta(x)$ of the microwaves to be strengthened at a focal position C1 of the dielectric window 5, the microwave electric field became strong at the focusing portion Ar centered on the focal position C1 as shown in FIG. 6B.

Then, the phases of the microwaves radiated from the nineteen electromagnetic wave radiating devices 2 were controlled using the phase shifters 7 such that the focusing portion Ar where the microwave electric field is strong moves toward the center in the radial direction. FIG. 6C shows an example of the simulation result of the electric field distribution in the dielectric window 5 at this time. According to this, it was possible to move the portion where the microwave electric field is strong to the focusing portion Ar centered on a focal position C2. This simulation has confirmed that free focusing control can be performed by the phase control.

As described above, in accordance with the plasma processing apparatus 10 of the present embodiment, the electric field distribution in the dielectric window 5 can be changed regardless of the arrangement of the electromagnetic wave radiating devices 2. Accordingly, free focusing control can be performed by the phase control, and the plasma distribution can be freely controlled.

Although a plasma processing apparatus that radiates microwaves has been described as an example of the plasma processing apparatus 10 of the present disclosure, the present disclosure is not limited thereto. The electromagnetic wave radiating devices 2 of the plasma processing apparatus 10 of the present disclosure may radiate electromagnetic waves having a frequency of 100 MHz or higher, such as UHF or the like, other than microwaves. More preferably, the electromagnetic wave radiating devices 2 may radiate electromagnetic waves having a frequency within a range of 1 GHz to 3 GHz. The phase control can be performed at a higher speed as the frequency becomes higher.

In the above-described embodiment, the space V above the dielectric window 5 is set to an atmospheric space. However, the present disclosure is not limited thereto. For example, the space V above the dielectric window 5 may be filled with a dielectric made of material that is the same as or different from that of the dielectric window 5. The wavelength of the microwaves propagating in the dielectric can be shortened by filling the space V with the dielectric, which makes it possible to make the plasma processing apparatus 10 small.

In the above-described embodiment, the space V above the dielectric window 5 is set to an atmospheric space. However, the space V may be set to a vacuum space. However, when the space V is set to a vacuum space, the phase control is performed in the vacuum space and, thus, plasma may be formed in the space V. Therefore, it is more preferable to set the space V above the dielectric window 5 to an atmospheric space. By setting the distance D between the radiating device 125 and the dielectric window 5 to be greater than ¼ of the wavelength λ of the microwave, the microwaves can be sufficiently focused on the dielectric window 5.

While embodiments of the plasma processing method and the plasma processing apparatus of the present disclosure have been described, the present disclosure is not limited to the above-described embodiments. Various changes, modifications, substitutions, additions, omissions, and combinations can be made without departing from the scope of the claims, and it is to be understood that these are also included in the technical scope of the present disclosure.

This application claims priority to Japanese Patent Application No. 2019-071541, filed on Apr. 3, 2019, the entire contents of which are incorporated herein by reference.

DESCRIPTION OF REFERENCE NUMERALS

1: chamber
2: electromagnetic wave radiating device
3: stage
5: dielectric window
6: microwave output unit
7: phase shifter
8: controller
9: ceiling plate
10: plasma processing apparatus
11: monopole antenna
121: inner conductor
122: outer conductor
124: notch
125: radiating device

The invention claimed is:

1. A plasma processing method in a plasma processing apparatus including a chamber, a stage on which a substrate is placed in the chamber, a plurality of radiating devices configured to radiate a plurality of electromagnetic waves, and a dielectric window disposed between the plurality of radiating devices and the stage, the method comprising:
preparing the substrate on the stage;
controlling a phase of at least one of the plurality of electromagnetic waves from the plurality of radiating devices;
propagating the plurality of electromagnetic waves from the plurality of radiating devices into a space above the dielectric window for focusing electromagnetic waves, concentrating the electromagnetic waves from the plurality of radiating devices at a predetermined position on the dielectric window, and radiating the concentrated electromagnetic waves into a space below the dielectric window, wherein the dielectric window is a partition plate that divides an inside of the chamber into the space above the dielectric window and the space below the dielectric window; and
processing the substrate using localized plasma generated from a gas supplied between the dielectric window and the stage.

2. The plasma processing method of claim 1, wherein the dielectric window is separated from the plurality of radiating devices and the stage, and
wherein in said processing the substrate, the localized plasma is generated in the space below the dielectric window.

3. The plasma processing method of claim 2, wherein a vertical distance from the plurality of radiating devices to the dielectric window is greater than ¼ of a wavelength λ of the electromagnetic wave.

4. The plasma processing method of claim 1, wherein each of the plurality of radiating devices has a monopole antenna.

5. The plasma processing method of claim 1, wherein a distance from a center of the radiating device to a center of an adjacent radiating device is smaller than ½ of a wavelength λ of the electromagnetic wave.

6. The plasma processing method of claim 1, wherein the plurality of electromagnetic waves have a frequency of 100 MHz or higher.

7. The plasma processing method of claim 6, wherein the plurality of electromagnetic waves have a frequency of 1 GHz to 3 GHz.

8. The plasma processing method of claim 1, wherein a region where the localized plasma is generated is controlled by changing phases of the plurality of electromagnetic waves over time.

9. A plasma processing apparatus comprising:
a chamber;
a stage on which a substrate is placed in the chamber;
a plurality of radiating devices configured to radiate a plurality of electromagnetic waves;
a dielectric window disposed between the plurality of the radiating devices and the stage, wherein the dielectric window is a partition plate that divides an inside of the chamber into a space above the dielectric window for focusing electromagnetic waves and a space below the dielectric window; and
a controller,
wherein the controller is configured to control:
preparing the substrate on the stage;

controlling a phase of at least one of the plurality of electromagnetic waves from the plurality of radiating devices;

propagating the plurality of electromagnetic waves from the plurality of radiating devices into the space above the dielectric window, concentrating the electromagnetic waves from the plurality of radiating devices at a predetermined position on the dielectric window, and radiating the concentrated electromagnetic waves into the space below the dielectric window; and processing the substrate using localized plasma generated from a gas supplied between the dielectric window and the stage.

\* \* \* \* \*